(12) United States Patent
Oster et al.

(10) Patent No.: US 10,636,716 B2
(45) Date of Patent: Apr. 28, 2020

(54) THROUGH-MOLD STRUCTURES

(71) Applicant: Intel Corporation, Santa Clara, CA (US)

(72) Inventors: Sasha Oster, Chandler, AZ (US); Srikant Nekkanty, Chandler, AZ (US); Joshua D. Heppner, Chandler, AZ (US); Adel A. Elsherbini, Chandler, AZ (US); Yoshihiro Tomita, Tsukuba (JP); Debendra Mallik, Chandler, AZ (US); Shawna M. Liff, Scottsdale, AZ (US); Yoko Sekihara, Ibaraki (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/992,830

(22) Filed: May 30, 2018

(65) Prior Publication Data
US 2018/0277458 A1      Sep. 27, 2018

Related U.S. Application Data

(63) Continuation of application No. 14/973,184, filed on Dec. 17, 2015, now abandoned.

(51) Int. Cl.
*H01L 23/31* (2006.01)
*H01L 23/367* (2006.01)
(Continued)

(52) U.S. Cl.
CPC ........ *H01L 23/3121* (2013.01); *H01L 21/565* (2013.01); *H01L 23/3675* (2013.01);
(Continued)

(58) Field of Classification Search
CPC ....... H01L 23/481; H01L 23/538–5389; H01L 23/498–49894; H01L 23/49827;
(Continued)

(56) References Cited

U.S. PATENT DOCUMENTS

| 5,726,493 A | 3/1998 | Yamashita et al. |
| 6,337,265 B1 | 1/2002 | Trezza et al. |

(Continued)

FOREIGN PATENT DOCUMENTS

| DE | 112016005820 | 8/2018 |
| WO | 2015099684 | 7/2015 |
| WO | 2017105659 | 6/2017 |

OTHER PUBLICATIONS

"U.S. Appl. No. 14/973,184, Response filed Mar. 2, 2018 to Final Office Action dated Jan. 2, 2018", 7 pgs.
(Continued)

*Primary Examiner* — Tod T Van Roy
*Assistant Examiner* — Sean P Hagan
(74) *Attorney, Agent, or Firm* — Schwegman Lundberg & Woessner, P.A.

(57) ABSTRACT

Examples of an electronic package include a package assembly. The package assembly can include a substrate having a first substrate surface that includes a conductive layer attached to the first substrate surface. The package assembly includes a die communicatively coupled to the conductive layer and a contact block that includes a first contact surface on one end of the contact block, a second contact surface on an opposing side of the contact block, and a contact block wall extended therebetween. The contact block can include a conductive material. The first contact surface can be coupled to the package assembly with a joint extended partially up the contact block wall. The electronic package can further include an overmold covering portions of the substrate, conductive layer, and die. The second contact surface of the contact block can be exposed through the overmold.

17 Claims, 7 Drawing Sheets

(51) Int. Cl.
*H01L 23/498* (2006.01)
*H01L 21/56* (2006.01)
*H01L 23/48* (2006.01)
*H01L 23/58* (2006.01)
*H01L 23/66* (2006.01)
*H01L 23/00* (2006.01)

(52) U.S. Cl.
CPC ........ *H01L 23/3677* (2013.01); *H01L 23/481* (2013.01); *H01L 23/49811* (2013.01); *H01L 23/58* (2013.01); *H01L 23/66* (2013.01); *H01L 24/32* (2013.01); *H01L 24/83* (2013.01); *H01L 24/16* (2013.01); *H01L 24/81* (2013.01); *H01L 2223/6677* (2013.01); *H01L 2224/13101* (2013.01); *H01L 2224/16225* (2013.01); *H01L 2224/32225* (2013.01); *H01L 2224/81024* (2013.01); *H01L 2224/81192* (2013.01); *H01L 2224/81815* (2013.01); *H01L 2224/8385* (2013.01); *H01L 2224/83801* (2013.01); *H01L 2924/10253* (2013.01); *H01L 2924/10329* (2013.01); *H01L 2924/1433* (2013.01); *H01L 2924/181* (2013.01)

(58) Field of Classification Search
CPC .................. H01L 23/645; H01L 23/66; H01L 2223/66–6694; B01L 3/5027; B01L 3/502707; B01L 3/502715
See application file for complete search history.

(56) References Cited

U.S. PATENT DOCUMENTS

| 6,765,299 | B2 | | 7/2004 | Takahashi et al. | |
|---|---|---|---|---|---|
| 6,821,819 | B1 | * | 11/2004 | Benavides | H01L 23/4334 257/E23.092 |
| 8,500,979 | B2 | * | 8/2013 | Elibol | G01N 27/3278 204/409 |
| 2008/0150187 | A1 | * | 6/2008 | Daniel | B82Y 10/00 264/132 |
| 2008/0296735 | A1 | | 12/2008 | Takehara et al. | |
| 2008/0316714 | A1 | | 12/2008 | Eichelberger et al. | |
| 2009/0250249 | A1 | * | 10/2009 | Racz | B81C 1/00333 174/252 |
| 2009/0289336 | A1 | | 11/2009 | Meghro et al. | |
| 2009/0315170 | A1 | | 12/2009 | Shim et al. | |
| 2010/0133704 | A1 | * | 6/2010 | Marimuthu | H01L 21/565 257/778 |
| 2011/0104828 | A1 | * | 5/2011 | Balucani | H01L 21/6835 438/3 |
| 2011/0149493 | A1 | | 6/2011 | Kwon et al. | |
| 2011/0260334 | A1 | | 10/2011 | Hasegawa | |
| 2013/0075936 | A1 | * | 3/2013 | Lin | H01L 24/19 257/777 |
| 2013/0077280 | A1 | | 3/2013 | Bemmerl et al. | |
| 2013/0119549 | A1 | | 5/2013 | Cheng et al. | |
| 2013/0237055 | A1 | | 9/2013 | Funaya et al. | |
| 2013/0277821 | A1 | | 10/2013 | Lundberg | |
| 2014/0035154 | A1 | | 2/2014 | Geitner | |
| 2014/0111273 | A1 | * | 4/2014 | Jou | H01L 24/18 327/564 |
| 2014/0225248 | A1 | | 8/2014 | Henderson et al. | |
| 2015/0194388 | A1 | | 7/2015 | Pabst et al. | |
| 2015/0282308 | A1 | * | 10/2015 | Meyer | H01L 25/105 361/729 |
| 2015/0348912 | A1 | | 12/2015 | Su et al. | |
| 2016/0187483 | A1 | | 6/2016 | Luan et al. | |
| 2017/0178990 | A1 | | 6/2017 | Oster et al. | |

OTHER PUBLICATIONS

"U.S. Appl. No. 14/973,184, Final Office Action dated Jan. 2, 2018", 20 pgs.
"International Application Serial No. PCT US2016 060295, International Search Report dated Feb. 28, 2017", 3 pgs.
"U.S. Appl. No. 14/973,184, Response filed Jul. 5, 2017 to Restriction Requirement dated May 5, 2017", 7 pgs.
"U.S. Appl. No. 14/973,184, Restriction Requirement dated May 5, 2017", 7 pgs.
"International Application Serial No. PCT US2016 060295, Written Opinion dated Feb. 28, 2017", 8 pgs.
"U.S. Appl. No. 14/973,184, Response filed Oct. 30, 2017 to Non Final Office Action dated Jul. 28, 2017", 15 pgs.
"U.S. Appl. No. 14/973,184, Non Final Office Action dated Jul. 28, 2017", 19 pgs.
"U.S. Appl. No. 14/973,184, Advisory Action dated Apr. 17, 2018", 3 pgs.
"International Application Serial No. PCT US2016 060295, International Preliminary Report on Patentability dated Jun. 28, 2018", 10 pgs.

* cited by examiner

THROUGH-MOLD STRUCTURES

CROSS-REFERENCE TO RELATED APPLICATION

This application is a continuation of U.S. patent application Ser. No. 14/973,184, filed Dec. 17, 2015, which is incorporated by reference herein in its entirety.

TECHNICAL FIELD

This document pertains generally, but not by way of limitation, to electronic packaging, such as molded microelectronic packaging.

BACKGROUND

Electronic packages, such as electronic packages including through-mold vias, can include vias within an overmold of the electronic package. For instance the through-mold vias can electrically couple a first die to a second die to provide electrical communication between the first and second dies. Constructing the through-mold vias can include laser drilling the overmold to expose an area of conductive material on a substrate of the electronic package. The laser drilling operation can produce an opening through the overmold. Through-mold vias can be constructed within the opening by a plating process applied to the electronic package. In an example, one or more layers of conductive material can be electroplated on the exposed conductive area, filling at least a portion of the opening in the overmold. In an example, solder paste or conductive ink can be deposited within the opening to create an electrically conductive through-mold via. It is desirable to improve through-mold interconnections, through-mold functionality, and methods for the same.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following description and the drawing sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
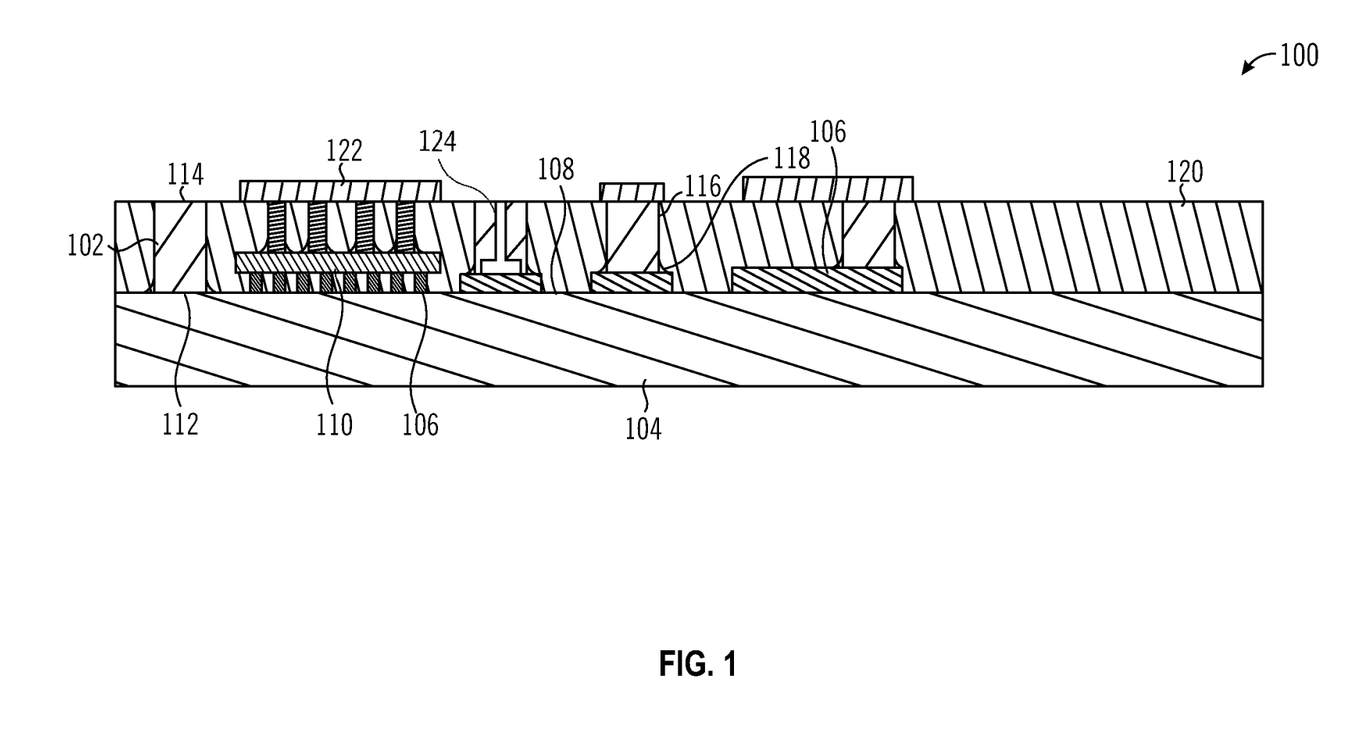
FIG. 1 is a cross section view of an electronic package in accordance with some embodiments.

FIG. 1 is cross section of an exemplary electronic package 100 including a through mold interconnect, such as a through-mold via including a contact block 102. The electronic package 100 can include a substrate 104. The substrate 104 can include one or more conductive layers 106. At least one conductive layer 106 can be located on a first substrate surface 108. For instance, the conductive layer 106 can be attached to (e.g., laminated on) an upper or lower surface of the substrate 104. A die 110 can be coupled to the conductive layer 106. For instance, the die 110 can include at least one contact attached to the conductive layer 106. For instance, the die 110 can be attached to the conductive layer 106 with conductive adhesive or solder. The die 110 can be in electrical communication with other elements of the electronic package 100 or other electronic devices coupled to the electronic package 100 through the conductive layer 106. A package assembly (as shown and described further herein) can include the substrate 104, the conductive layer 106, and the die 110. The contact block 102 can include a first contact surface 112 on one end of the contact block 102 and a second contact surface 114 on an opposing end of the contact block 102. A contact block wall 116 extends between the first contact surface 112 and the second contact surface 114. The contact block 102 can be coupled to the package assembly. For instance, the contact block 102 can be coupled to the conductive layer 106, the die 110, or the substrate 104. Optionally, the electronic package 100 include a plurality of contact blocks 102 coupled to the conductive layer 106, die 110, substrate 104, or any combination thereof. The contact block 102 can be coupled to the package assembly by a joint 118. An overmold 120 can be applied to the package assembly. At least a portion of the substrate 104, the conductive layer 106, and the die 110 can be covered by the overmold 120. The second contact surface 114 can be exposed through the overmold 120. As shown in the example of FIG. 1, the electronic package 100 can optionally include a structure 122 coupled to the second contact surface 114. In one example, the structure 122 can be coupled to the overmold 120. For instance, the structure 122 can be coupled to the upper surface of the overmold 120 as shown in FIG. 1.

The contact block 102 can communicate electrical signals or thermal energy from the conductive layer 106 or die 110 to the structure 122. For instance, the contact block 102 can be electrically conductive, thermally conductive, or both. In some examples, the contact block 102 can include, but is not limited to, a battery contact, heat sink, signal contact, or the like. In one example the contact block 102 can include a cross sectional area greater than the cross sectional area of an electrodeposited (plated) through-mold via, such as a cross sectional area of 0.05 mm$^2$ or greater. In other words, the contact block can include a cross-sectional dimension of 250 microns or greater. Increasing the cross sectional area of the contact block 102 can provide for greater power transmission or heat transfer through the contact block 102. Where the contact block 102 includes a battery contact or a heatsink, increasing the cross sectional area of the contact block 102 can improve the operation of the battery contact or heatsink. The contact block 102 can include a height of 0.20 mm to 1.0 mm or a height exceeding 1.0 mm. In one example, taller contact blocks 102 can extend (and be exposed) through the overmold 120 of taller electronics packages 100. In one example, less space within the electronics package 100 can be used by a contact block 102 having a vertical sidewall. In other words, limitations of one process for fabricating the contact block 102 (e.g., by laser drilling and/or electroplating) can be avoided by fabricating the contact block 102 by processes other than those used in printed circuit board fabrication and assembly.

The shape of the contact block 102 can be any shape that has sufficient stability for placement on the conductive pad layer 106. For instance, the contact block 102 can include, but is not limited to, a cylindrical, rectangular, hollow cylinder, or other. In one or more examples, the contact block 102 can include a complex geometry 124. The complex geometry 124 can be included in the electronics package 100 by fabricating the contact block 102 outside of the overmold 120. For instance, complex geometries 124 as referred to herein can include, but are not limited to, a truss, spiral, threaded bushing anchor (e.g., dovetail), microfluidic conduit, boule, spheroid, hourglass, nozzle, mesh, grid, convoluted shape, or other. The complex geometry 124 can be included on the contact black wall 116 or internal to the contact block 102. For instance, the contact block 102 can include a geometry configured as a microfluidic conduit, structural reinforcement, threaded bushing, electromagnetic shield, filter, metamaterial, or the like. In the example of FIG. 1, the contact block 102 can include a complex geometry 124 configured as a microfluidic cavity. For instance, the contact block 102 can include complex geometry 124 including an internal cavity. The internal cavity can have an aperture located on the second contact surface 114. The width of the cavity on the first contact surface 112 or internally to the contact block 102 can be greater than the width of the aperture. In one example, the shape of the second contact surface 114 can differ from the shape of the first contact surface 112. In another example, the shape of the second contact surface 114 can differ from the shape of the contact block 102 between the first contact surface 112 and the second contact surface 114. In a further example, the contact wall 116 can be non-symmetrical.

In one example, the contact block 102 can be fabricated (e.g., prefabricated) from materials including but not limited to, copper, nickel, tin, zinc, silver, gold, or any combination thereof. For instance the contact block 102 can include a thermal conductivity of 35-500 $W \cdot m^{-1} \cdot k^1$ or an electrical conductivity of $15 \times 10^6$-$65 \times 10^6$ $\Omega^{-1} \cdot m^{-1}$. In one example, the thermal conductivity of the contact block 102 can exceed 80 $W \cdot m^{-1} \cdot k^1$. Accordingly, greater heat transfer can be achieved through the contact block 102 as compared to correspondingly sized and shaped through-mold interconnects including various solder compositions. The contact block can be fabricated by a process including but not limited to, cold working, casting die casting forging, extrusion, sintering or the like. Accordingly, the contact block 102 can be substantially free of voids, cracks and include a substantially planar first contact surface 112 and second contact surface 114. In one example, the contact block 102 can include a homogeneous microstructure. In one example, the contact block 102 can be magnetic. A magnetic contact block 102 can be configured as a sensor, antenna, inductor (e.g., inductor core), or other. In one example, the contact block 102 can be coated with a material (e.g., a carrier material or insulator material as further described herein) for decreasing the frequency loss of electrical signals through the contact block 102. For instance, the contact block 102 can be coated with a Liquid Crystal Polymer (LCP), epoxy resin, or other material with good frequency loss characteristics. In one example the contact block 102 can be coated with solder or plated with nickel, for instance, to improve solder wettability. In one example the contact block 102 can include a composite material. Accordingly, by including the contact block 102 in the electronic package 100, a portion of the overmold volume can be used for an antenna, battery contact, heat sink, inductor, or the like.

Figure 2A:
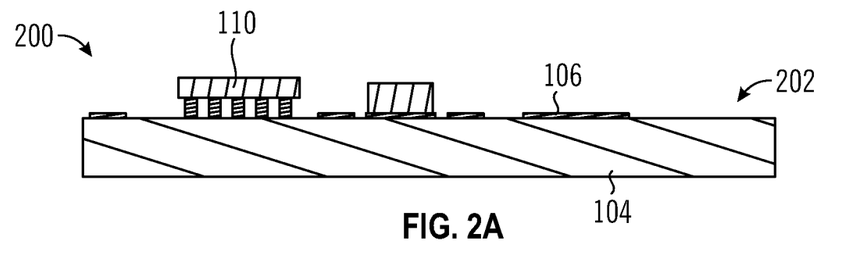
FIGS. 2A-D illustrate a process diagram of a method of constructing a through-mold interconnect in accordance with some embodiments.
Figure 2B:
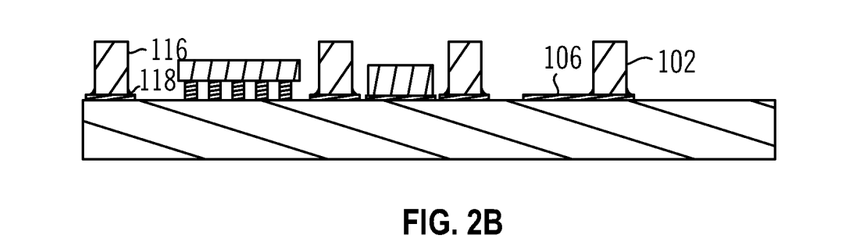
Figure 2C:
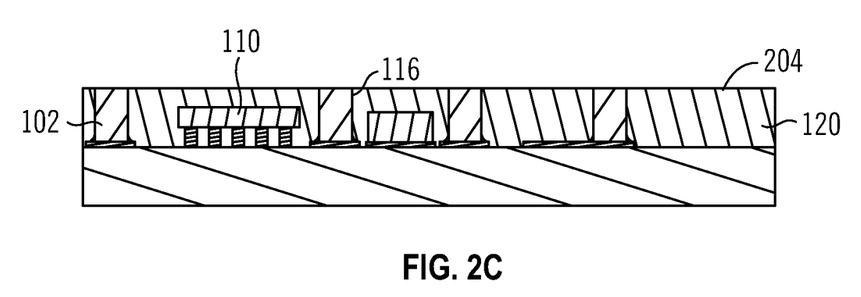
Figure 2D:
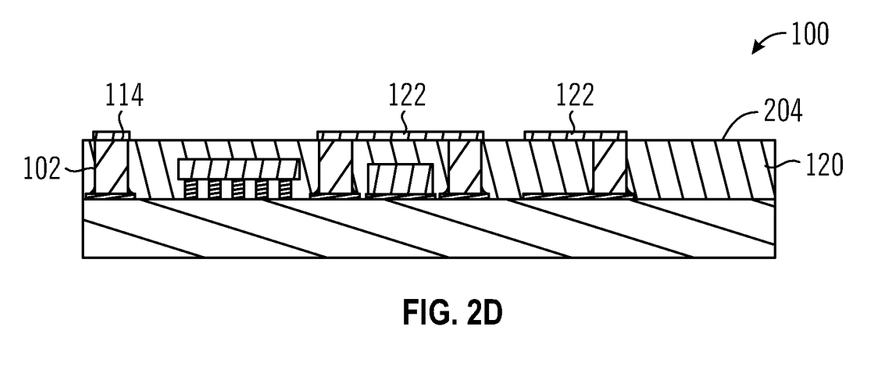

FIGS. 2A-D illustrate an exemplary process 200 for constructing an electronic package 100 having a through-mold interconnect including a contact block 102. FIG. 2A illustrates a package assembly 202 created by the process 200. FIG. 2B shows a plurality of contact blocks 102 coupled to the conductive layer 106 of the package assembly 202. An over mold can be formed on the package assembly 202 and partially around the one or more contact blocks 102 as depicted in FIG. 2C. FIG. 2D shows one or more structures 122 coupled to the second contact surface 114 and optionally the overmold 120.

As shown in FIG. 2A, the package assembly 202 can include the substrate 104, the conductive layer 106, and the die 110. The conductive layer 106 can be coupled to the substrate 104 in one or more ways. In one example, the conductive layer 106 can be electrodeposited (electroplated) on to the first substrate surface 108. In one example, the conductive layer 106 can include a foil sheet that can be attached to (e.g., laminated on) the first substrate surface 108 with an adhesive. In one example, the conductive layer 106 can be printed on to the substrate 104, for instance with an inkjet printer. Once the conductive layer 106 is coupled to the substrate 104, the conductive layer 106 can then be etched to create contacts, solder pads, circuit traces, or the like. In one example, a cover layer (e.g., solder resist) can be attached on the conductive layer 106 and the substrate 104. For instance, the cover layer can be laminated over the conductive layer 106 and the substrate 104. One or more openings can be included in the cover layer to expose the conductive layer 106, for example, to expose solder pads, contacts, electrodes, or the like.

The substrate 104 can include a single sided, double sided, or multilayer construction. For instance, the substrate 104 can have dielectric layers fabricated from materials including but not limited to, FR-4, prepreg, ceramic, epoxy, other glass or fiber filled resin, or the like. The substrate 104 can provide mechanical support for the electronic package 100, a platform for routing circuits, thermal distribution, or electromagnetic shielding among other things.

At least one conductive layer 106 can be attached on each dielectric layer. For instance, each dielectric layer can be interposed between conductive layers 106 to form alternating dielectric and conductive layers 106. The conductive layer 106 can be fabricated from conductive materials including but not limited to, cold-rolled copper, electrodeposited copper, or other conductive materials or foils. In one example, the conductive layer 106 can include a copper clad laminate. Electrical signals and thermal energy can be communicated through the conductive layer 106 to the one or more contact blocks 102.

The process 200 can further include coupling a die 110 to the conductive layer 106 as shown in the example of FIG. 2A. The die 110 can include one or more contacts coupling the die 110 to the conductive layer 106. The one or more contacts can include, but are not limited to, at least one surface mount lead, a ball grid array, land grid array, or the like. In one example, the contact of the die 110 can be soldered to the conductive layer 106. For instance, the die 110 can be placed (e.g., by a pick-and-place machine) on solder paste deposited over the conductive layer 106. The die 110 can then be soldered to the conductive layer 106 by passing the package assembly 202 through an oven, such as a reflow oven or infrared oven. The die 110 can include a circuit, such as an integrated circuit. In one example, the die 110 can be fabricated from a silicon wafer, gallium arsenide, or other semiconductor. The die 110 can include, but is not limited to, a processor, microprocessor, random access memory, radio, arithmetic unit, or the like. The die 110 can be in electrical communication with one or more conductive layers 106 through the contact.

As shown in the example of FIG. 2B, the contact black 102 (as previously described herein) can be coupled to the conductive layer 106 with the joint 118. The contact block 102 can be fabricated prior to placement or coupling to the conductive layer 106. In other words, the contact block 102 can be prefabricated. For instance, the joint 118 can be fabricated from a material (hereinafter joint material) including, but not limited to, solder, flux, adhesive, thermally conductive adhesive, electrically conductive adhesive, or the like. The joint material can be deposited on the package assembly 202, such as on the substrate 104, the conductive layer 106, or the die 110. The contact block 102 can be placed on the joint material. For instance, the contact block 102 can be placed with a pick-and-place machine as previously described. Time and cost can be saved by placing the contact block 102 on to the package assembly 202 as compared to fabricating the through-mold interconnect by electrodepositing one or more layers of conductive material on the package assembly 202. For instance, time and cost can be saved particularly where the contact block includes increased cross sectional area, three-dimensional complexity, and/or height. In another example, time and cost can be reduced by eliminating process steps. For instance, the die 110 or other components are placed on the conductive layer 106. The contact block 102 can also be placed with the same equipment and during the same placement session as the die 110 or other components.

In one example, the joint material can include solder. The joint 118 can be formed by passing the joint material through an oven to solder the contact block 102 to the package assembly 202 (e.g., solidify the solder). A portion of the joint 118 can be coupled to the contact block wall 116. For instance, the joint 118 can extend partially up the contact wall 116 or be located partially along the contact wall 116. In one example, the joint 118 can include a fillet shape having one end of the fillet on the contact block wall 116 and the other end of the fillet along the package assembly 202. In one example, the joint 118 can be located between the first contact surface 112 and the packages assembly 202.

In one example, the joint material can include an adhesive or other tacky substance to hold the contact block 102 in place. In one example, the joint material can be cured to create a joint 118 that is solid. In other examples the joint material can be uncured. In other words, the joint material can include a tacky characteristic holding the contact block 102 in place, but can remain somewhat viscous, for instance, to allow easier removal of the contact block 102 and/or the joint 118. As previously described, the joint 118 can extend partially up the contact block wall 116 or can be located partially along the contact wall 116.

The joint 118 can increase the robustness of the electronics package 100 due to the increased cross sectional area of the joint 118 where the contact block 102 is coupled to the package assembly 202. Robustness can also be increased by the joint 118 by reducing a stress concentration factor (e.g., minimizing sharp corners) at the junction of the contact block 102 and the package assembly 202.

As shown in the example of FIG. 2C, the overmold 120 can be applied to the package assembly 202 and the contact block 102. For instance, the overmold 120 can cover at least a portion of the substrate 104, a portion of the conductive layer 106, or a portion of the die 110. In the example of FIG. 2C, the overmold 120 can cover the upper side of the package assembly 202 and surround the contact block wall 116. The overmold 120 can be formed or placed on the package assembly 202. For instance, the overmold 120 can be molded on the package assembly 202, for example, encapsulated, compression molded, or other in situ fabrication process. The overmold 120 can be fabricated from materials including, but not limited to, a thermoset, epoxy, thermoplastic, polymer, or the like. The overmold 120 can include dielectric characteristics mitigating electrostatic discharge, shorting or the like. The electronic package 100 can be protected by the additional mechanical strength added by the overmold 120. The die 110 or electrical components can be shielded from potential contact and damage. The second contact surface 114 can be exposed through the overmold 120. In one example, the second contact surface 114 can be substantially aligned (flush) with the upper surface 204 of the overmold 120. In one example, the second contact surface can be covered by the overmold 120. The upper surface of the overmold 120 can be removed to expose the contact block 102. For instance, the upper surface 204 can be machined or wound to expose the second contact surface 114.

As shown in the example of FIG. 2D, one or more structures 122 can be coupled to the second contact surface 114, the upper surface 204 of the overmold 120, or both. The structure 122 can be coupled to the second contact surface 114 or upper surface 204 by plating (or electrodepositing), sputtering printing laminating adhering or other bonding process. In one example, the structure 122 can be placed on the second contact block surface 114 or upper surface 204. For instance, the structure 122 can be prefabricated and placed with a pick-and-place machine. The structure 122 can be coupled to the second contact block surface 114 or the upper surface 204 with adhesive or solder. The substantially flush (and flat) second contact surface 114 can facilitate the coupling of the structure 122. For instance, the flat and aligned second contact surface 114 and upper surface 204 can promote uniform bonding.

The structure 122 can include, but is not limited to, an antenna, heat sink, sensor, inductor, circuit, or other. For instance, a layer of conductive material, such as copper, can be attached to (e.g., laminated on) the second contact surface 114 and/or the upper surface 204. The conductive material can then be etched to create a geometry tuned as an antenna. The conductive material can be in electrical communication with the second contact surface 114 to transmit or receive signals through the antenna. Electrical circuits or inductor coils can be created in a similar lamination and etching process. In one example, the structure 122 can be configured as a heat sink. For instance, the structure 122 can include a thermally conductive material, such as aluminum, copper, zinc, or the like. The structure 122 can include a surface area configured to dissipate heat. For instance, the structure 122 can include fins or other geometry to increase surface area and accordingly increase heat dissipation.

FIGS. 3A-D show an exemplary process 300 for creating an aperture 304 in the overmold 120 of the electronic package 100. The process 300 illustrated in FIGS. 3A-D can include any or all of the steps shown in FIGS. 2A-D and described herein. For instance, in the example of FIG. 3A, a component 302 can be placed on the package assembly 202 (e.g., by a pick-and-place machine as previously described herein). The component 302 can be coupled to the substrate 104, the conductive layer 106, or the die 110 with solder, flux, solder paste, adhesive, electrically conductive adhesive, thermally conductive adhesive, or the like. In one example, the component 302 can be coupled to the conductive layer 106 located on the first substrate surface 108. In one example, the component 302 can be coupled to an internal conductive layer 106 (e.g., a conductive layer 106 located within the substrate 104 and interposed between two dielectric layers). For instance, the substrate 104 can include a cavity. The component 302 can be coupled to one or more of the internal conductive layers 106 exposed by the cavity. The component 302 can be located flush, below, or partially below the first substrate surface 108.

Figure 3A:
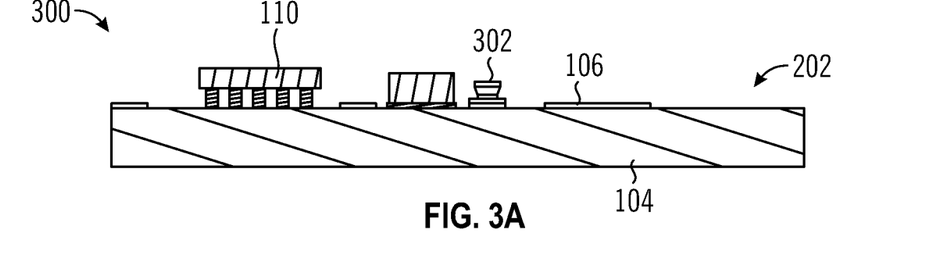
FIGS. 3A-D illustrate a process diagram of a method of forming an aperture in an overmold in accordance with some embodiments.

The component 302 can include, but is not limited to, a lens (e.g. Fresnel lens), a sensor (e.g., an optical sensor or environmental sensor), a metamaterial element, inductor, magnetic element (e.g., core), 3D printed component, discrete active, passive, or other type of component. The component 302 can include a solder wettable surface to facilitate coupling the component 302 to the package assembly 202 with solder.

Figure 3B:
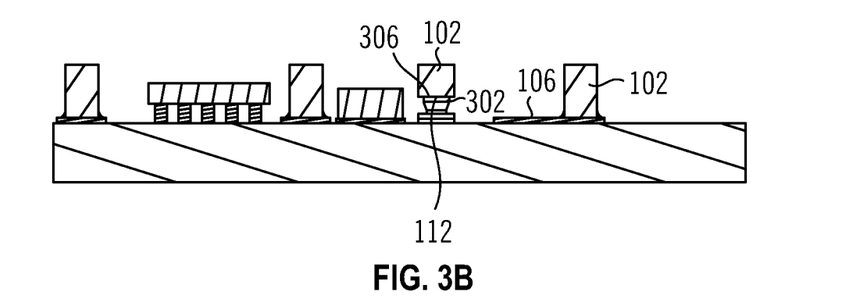

As shown in FIG. 3B, the contact block 102 can be coupled to the component 302. An adhesive or tacky substance can be applied or deposited on the component 302 to couple the contact block 102 to the component 302. The contact block 102 can be placed on the component 302, such as on the adhesive or tacky substance on the component 302. In one example, the contact block 102 can be placed on the component 302 with a pick-and-place machine. The component 302 can include a mounting surface 306 to facilitate the stability of the contact block 102 located on the component 302. For instance, the mounting surface 306 can be planar and the first contact surface 112 of the contact block 102 can be correspondingly planar. In one example, the mounting surface 306 and the first contact surface 112 can include a self-centering feature, such as a conical or frustoconical surface that can engage a corresponding mating feature on the opposing element.

Figure 3C:
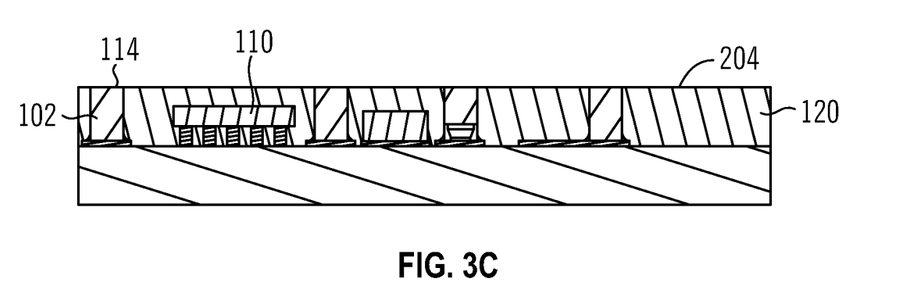
Figure 3D:
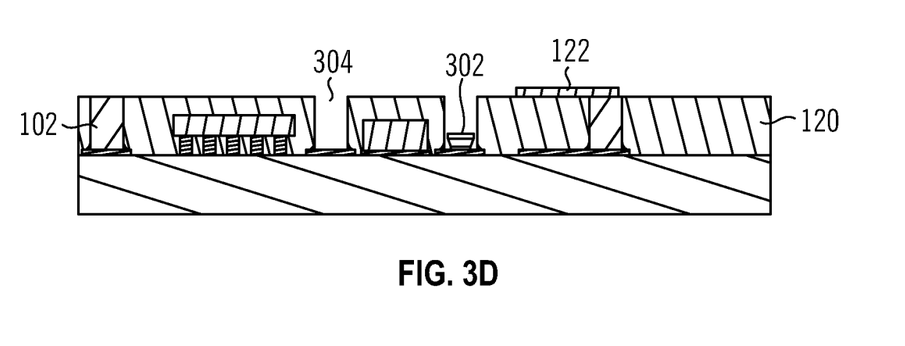

FIG. 3C shows an example of an overmold 120 applied on the package assembly 202 and surrounding the contact block 102 as previously described. The second contact surface 114 can be exposed through the upper surface 204 of the overmold 120. The contact block 102 can be removed from the overmold 120 as shown in FIG. 3D. For instance, the contact block 102 can be removed by a chemical etching process. The removal of the contact block 102 can create an aperture 304 within the overmold 120. The aperture 304 can expose all or a portion of the conductive layer 106, the component 302, the die 110, or other element. Exposed portions of the conductive layer 106 can be electrical contacts, electrodes, or other contacts. In some examples, removing the contact block 102 by etching can be more time and/or cost efficient than other methods of forming an aperture 304 in the overmold 120, such as mechanical or laser drilling.

In one example, removing the contact block 102 located on the component 302 can create an aperture 304 over the component 302. For instance, the aperture 304 can provide a sensor or lens with access to the exterior of the electronic package 100. In one example, removing the contact block 102 can also include removing a portion of the component 302, such as a sacrificial portion of the component 302. A cleaning process can follow the removal of the contact block 102, for instance, to remove any remaining solder, flux, adhesive, or other particulate on the mounting surface 306 of the component 302.

Figure 4:
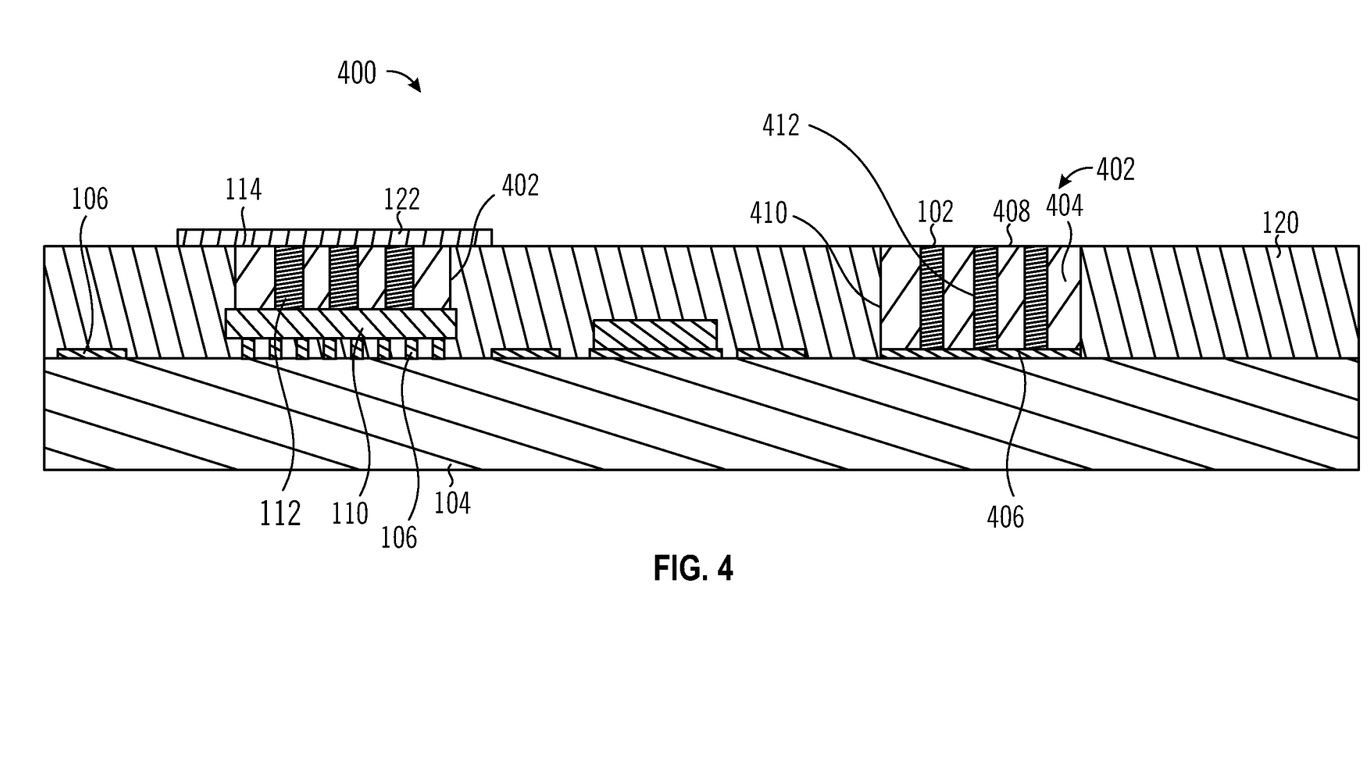
FIG. 4 is a cross section view of an electronic package including a through-mold interconnect having a carrier in accordance with some embodiments.

FIG. 4 shows an example of an electronics package 400 including a contact block assembly 402. The electronics package 400 can include the package assembly 202, as previously described herein. The contact block assembly 402 can include a carrier 404 and one or more contact blocks 102. In one example, a coating can be located between the contact block 102 and the carrier 404 (as shown in FIGS. 6A-E and described further herein). The contact block assembly 402 can be coupled to the package assembly 202 with solder or an adhesive. For instance, the contact block assembly 402 can be coupled to the substrate 104, the conductive layer 106, or the die 110. The overmold 120 can be applied to the package assembly 202 and around the contact block assembly 402.

The carrier 404 can include a first carrier surface 406 and a second carrier surface 408. A carrier wall 410 can extend from the first carrier surface 406 to the second carrier surface 408. As shown in the example of FIG. 4, the first carrier surface 406 can be coupled to the package assembly 202 and the second carrier surface 408 can be exposed through the overmold 120. The carrier 404 can be fabricated from a material including, but not limited to, a polymer (e.g., polyamide or LCP), epoxy, FR-4, prepreg, an elastomer, or the like. The carrier 404 can include one or more interstices 412. The interstice 412 can extend from the first carrier surface 406 to the second carrier surface 408 and can accommodate a contact block 102 (such as the contact block 102 previously described herein).

In one example, the contact block 102 can extend from the first carrier surface 406 to the second carrier surface 408. For instance, the first contact surface 112 of the contact block 102 can be substantially aligned with the first carrier surface 406 and the second contact surface 114 can be substantially aligned with the second carrier surface 408. In one example, the first contact surface 112 can be located at a distance from the first carrier surface 406, or the second contact surface 114 can be located at a distance from the second carrier surface 408, or both.

In one example, a component 302 (as previously described) can located within the carrier 404. For instance, the component 302 can be located within the interstice 412 of the carrier 404, or the component 302 can be insert molded into the carrier 404. In one example, other elements can be located within the carrier 404, such as 3D printed parts or the like. In one example, a lens, such as a Fresnel lens can be molded into the carrier 404. The component 302 or the carrier 404 can include a solder wettable surface for coupling the contact block assembly 402 to the conductive layer 106.

The contact block assembly 402 can provide support for a plurality of contact blocks 102. For instance, the contact block assembly 402 can include one or more contact blocks 102 having a combined cross sectional area of at least 0.05 mm$^2$. The carrier 404 can increase the robustness and flexibility of the electronic package 400. For instance, the plurality of contact blocks 102 can provide redundancy for electrical signal communication. Including a plurality of smaller contact blocks 102 in place of a single larger contact block 102 can improve the flexibility of the contact block assembly 402 and result in a larger cross sectional area of the contact blocks 102 in combination. The risk of voids, cracks, or shrinkage can be reduced by including the contact blocks (e.g., prefabricated contact blocks 102) in the contact block assembly 402. For instance, a fabrication process that includes a lower risk of voids, cracks, or shrinkage can be used in the creating of the contact block 102. In the example of FIG. 4, the structure 122 (as previously described herein) can be placed, attached, or laminated on the second carrier surface 408, the second contact surface 114, the overmold 120, or any combination thereof.

Figure 5A:
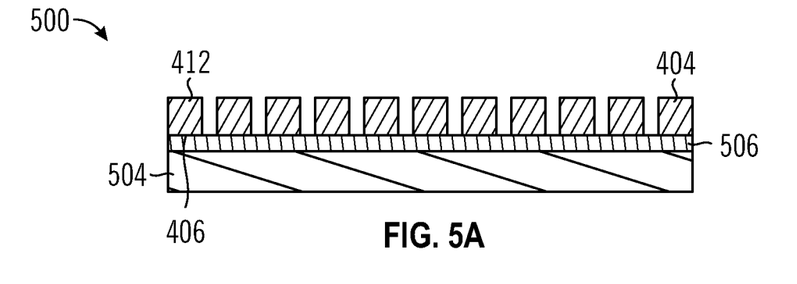
FIGS. 5A-E illustrate a process for constructing a through-mold interconnect within a carrier in accordance with some embodiments.

FIGS. 5A-E illustrate an exemplary process 500 for constructing a contact block assembly, such as the contact block assembly 402 (as previously described). As shown in FIG. 5A, the carrier 404 can be coupled to a support 504 by an adhesive 506. For instance, the carrier 404 can be coupled to the support 504 along the first carrier surface 406. One or more interstices 412 can be located within the carrier 404. The interstice 412 can extend from the first carrier surface 406 to the second carrier surface 408. The interstice 412 can be created by a number of processes including but not limited to, laser drilling punching or molding the interstice 412 into the carrier 404 during fabrication. The support 504 can include any substantially rigid member having a substantially flat surface along an upper side to hold the carrier 404 flat. For instance, the support 504 can include, but is not limited to, a panel fabricated from steel, aluminum, ceramic, polymer, or the like.

Figure 5B:
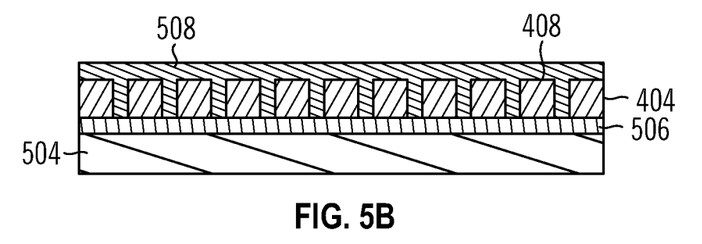

As shown in FIG. 5B, a conductive material 508 can be deposited on the second carrier surface 408 and in the interstice 412. For instance, the conductive material 508 can be dispensed in a liquid state through a nozzle, printed, sputtered, or spread along the second carrier surface 408 and can fill the interstice 412. The conductive material 508 can include, but is not limited to, copper, tin, lead, aluminum, steel, gold, silver, or any combination thereof. The volume of conductive material 508 deposited on the carrier 404 can be less than, substantially equal to, or greater than the combined volume of each interstice 412. In the example of FIG. 5B, the volume of conductive material 508 can be greater than the combined volume of each interstice 412. A viscous characteristic of the conductive material 508 can result in a substantially flat upper surface as the flow of conductive material 508 settles to a resting state. Accordingly, a sheet of conductive material 508 can be located on the second carrier surface 408. After the conductive material 508 is dispensed, it can solidify within the interstice 412 or on the second carrier surface 408.

Figure 5C:
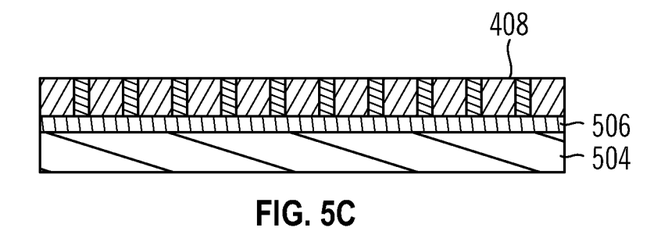

As shown in the example of FIG. 5C, the conductive material 508 can be removed from the second carrier surface 408. In one example, a portion of the carrier 404, such as the second carrier surface 408 can also be removed to create a planar surface along the upper side of the carrier 404. The conductive material 508 can be removed by a process including but not limited to, chemical etching machining grinding laser ablation, or the like. In one example, the conductive material 508 can be patterned on the second carrier surface 408, such as machined, laser etched, or chemically etched. For instance, a structure 122 (e.g., antenna, traces, or other) can be created from the conductive material 508 located on the second carrier surface 408.

Figure 5D:
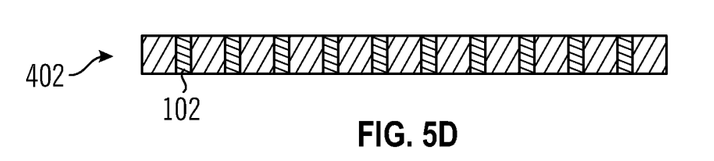
Figure 5E:
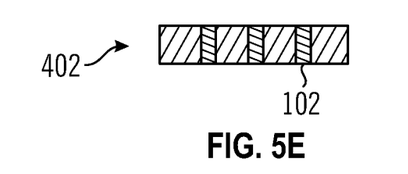

As shown in FIG. 5D, the support 504 and adhesive 506 can be removed from the first carrier surface 406. The adhesive can be removed by any mechanical or chemical process, such as a chemical bath dissolving the adhesive or a machining operation cutting the support 504 and the adhesive 506 from the carrier 404. Accordingly, the contact block assembly 402 can be created having one or more contact blocks 102 (e.g., fabricated from the conductive material 508) located within a lumen of the one or more interstices 412 of the carrier 404. The contact block assembly 402 can be divided into smaller contact block assemblies 402, as shown in the example of FIG. 5E. For instance, the contact block assembly 402 can be cut with a router or laser drill to create smaller contact block assemblies 402 having fewer contact blocks 102. The contact block assembly 402 can be placed and/or coupled to the package assembly 202 and the overmold 120 can be applied. The contact block 102, the structure 122, or both can be exposed through the overmold 120.

Figure 6A:
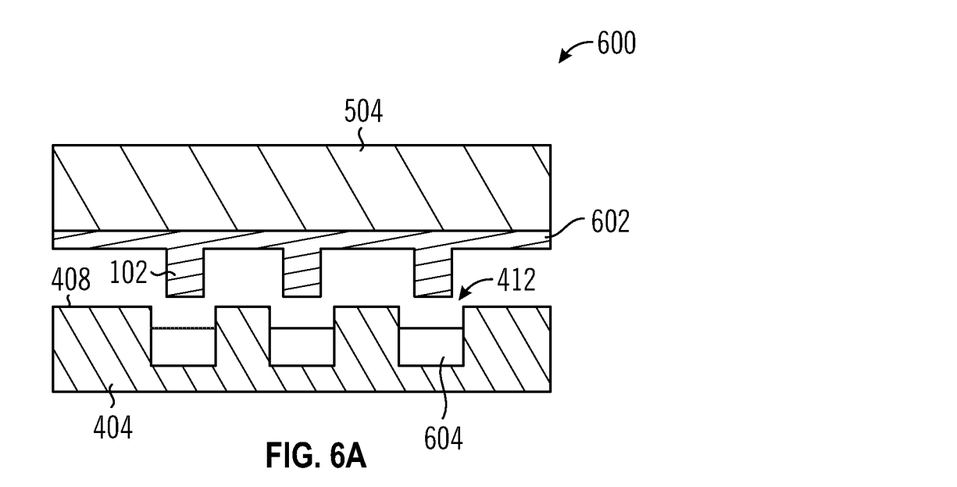
FIGS. 6A-C illustrates an exemplary a process for constructing a through-mold interconnect including an insulator within a carrier.
Figure 6B:
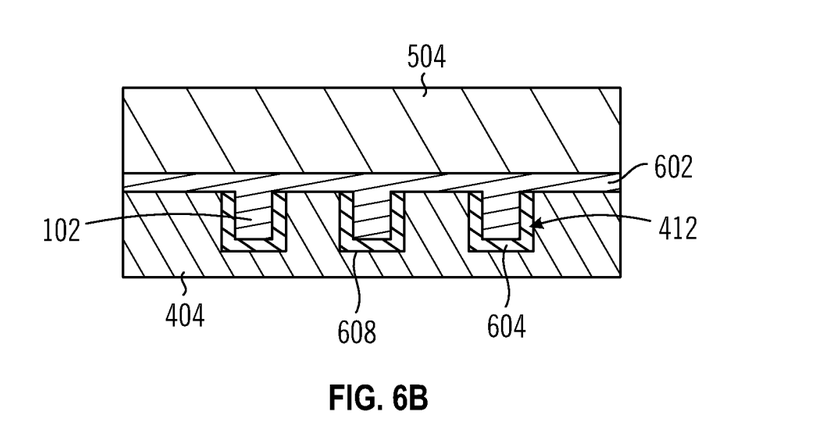
Figure 6C:
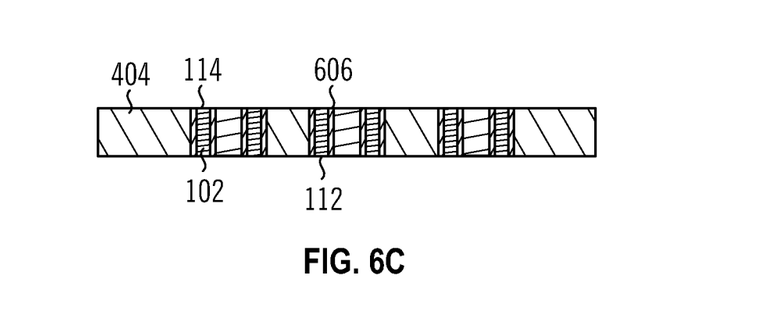

FIGS. 6A-C show an exemplary process 600 for fabricating a contact block assembly 402 including an insulator 606 located between the contact blocks 102. The insulator 606 can improve communication through the contact block 102. For instance, the insulator 606 can reduce signal loss through the contact block 102, such as high frequency signal loss. In one example, the insulator 606 or carrier 404 can include a material having a loss tangent between 0.002 and 0.007. As shown in the example of FIG. 6A, a interconnect base 602 can include one or more contact blocks 102 as previously described herein. For instance, the contact block 102 can be coupled to the interconnect base 602 with adhesive or solder or can be integral with the interconnect base 602. In one example, the contact block 102 can be fabricated on the interconnect base 602, such as electrodeposited, sputtered, printed, or the like. In one example, the contact block 102 can be coupled to the support 504. Where the interconnect base 602 or support 504 includes a plurality of contact blocks 102, the contact blocks 102 can be arranged in a pattern along the respective interconnect base 602 or support 504. For instance, the contact blocks 102 can include a linear, grid, radial, or randomized pattern along the interconnect base 602 or support 504. In the example shown in FIG. 6A, the interconnect base 602 can be mounted on the support 504, for example, with adhesive, as previously described herein.

The carrier 404 can include at least one interstice 412. The interstice 412 can extend partially through the carrier 404. For instance, the interstice 412 can extend from the second carrier surface 408 toward the first carrier surface 406. Optionally, the interstice 412 can extend through the carrier 404 to the first carrier surface 406. The carrier 404 can be fabricated as previously described herein.

As shown in FIG. 6A, an insulator material 604 can be deposited in the interstice 412. For instance, the insulator material 604 can be dispensed, injected, or printed into the interstice 412. The insulator material 604 can include, but is not limited to, a liquid epoxy resin, LCP, or other material having low loss characteristics (e.g., low loss tangent) at high signal frequencies. In one example, the insulator material 604 can be molded into the interstice 412 and can include a cured epoxy resin, solid LCP, glass-filed poly amide, or the like.

As shown in the example of FIG. 6B, the interconnect base 602 can be inserted into the interstice 412. A fit between a lumen of the interstice 412 and the interconnect base 602 can be a close fit, such as a clearance fit. The volume of insulator material 604 located within the interstice 412 can be sufficient to fill a gap between the interconnect base 602 and the carrier 404 once the interconnect base 602 is inserted into the interstice 412. Accordingly, a layer of insulator material 604 can be located around the interconnect base 602, between the contact block 102 and the carrier 404. In one example, the insulator material 604 can be cured or otherwise solidified to create the insulator 606.

FIG. 6C shows an example where the interconnect base 602 can be removed from the contact block 102 to expose the second contact surface 114. In one example, the interconnect base 602 can be patterned on the second carrier surface 408, such as machined, laser etched, or chemically etched. For instance, a structure 122 (e.g., antenna, traces, or other) can be created from the interconnect base 602 located on the second carrier surface 408. The first carrier surface 406 can also be removed from the contact block assembly 102 to expose the first contact surface 112. Accordingly, the contact block assembly 402 can include one or more contact blocks 102 having the insulator 606 located between the contact block 102 and the carrier 404. In one example, the first carrier surface 406 and the second carrier surface 408 can be ground or polished to a smooth surface finish. A cleaning process can be applied to the first contact surface 112 or the second contact surface 114 to prepare the surfaces for soldering or adhesion to the package assembly 202. Accordingly, a through-mold interconnect with high frequency performance (i.e., reduced signal loss) can be created.

Figure 7:
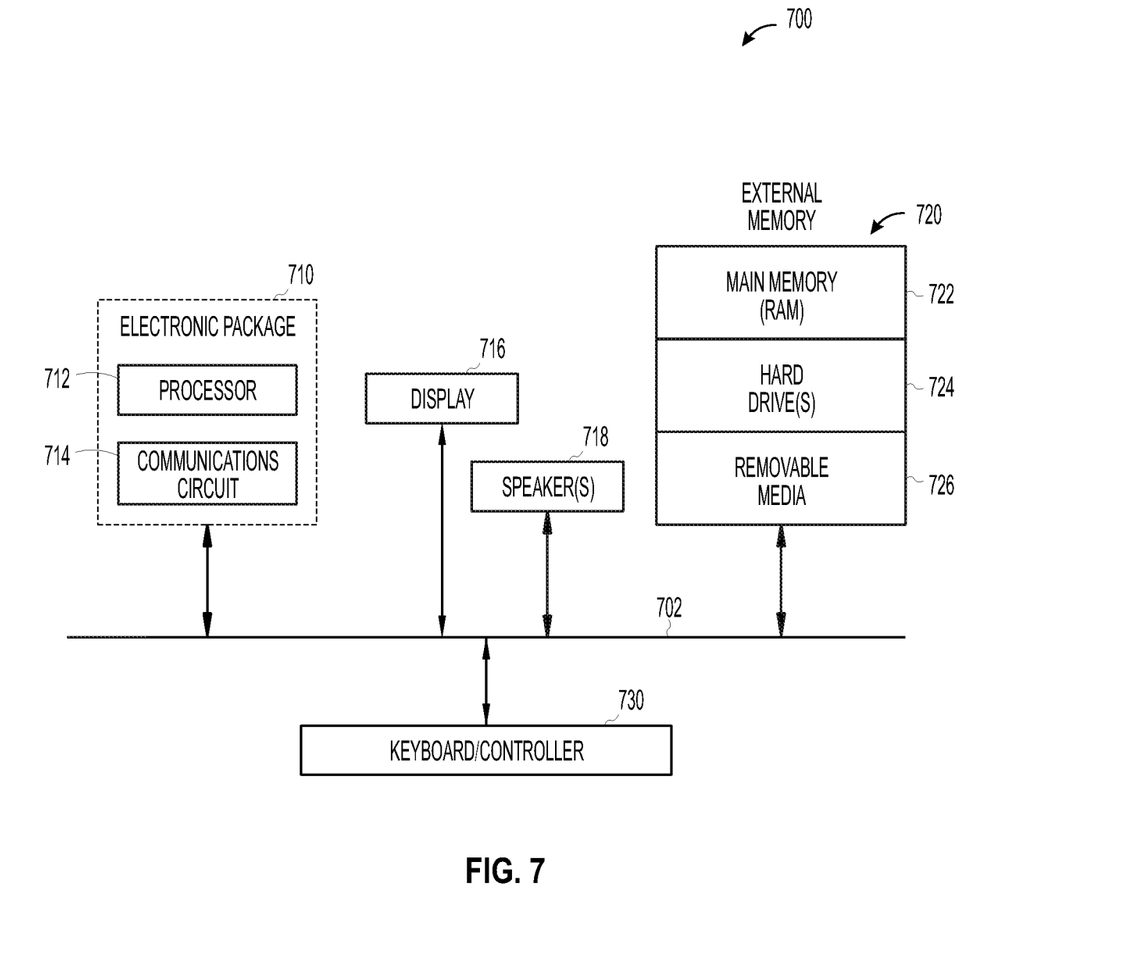
FIG. 7 is a block diagram of an electronic device incorporating at least one contact block and/or method in accordance with at least one embodiment.

An example of an electronic device using semiconductor chip assemblies and solders as described in the present disclosure is included to show an example of a higher level device application for the present invention. FIG. 7 is a block diagram of an electronic device 700 incorporating at least one solder and/or method in accordance with at least one embodiment of the invention. Electronic device 700 is merely one example of an electronic system in which embodiments of the p resent invention can be used. Examples of electronic devices 700 include, but are not limited to personal computers, tablet computers, mobile telephones, game devices, MP3 or other digital music players, etc. In this example, electronic device 700 comprises a data processing system that includes a system bus 702 to couple the various components of the system. System bus 702 provides communications links among the various components of the electronic device 700 and can be implemented as a single bus, as a combination of busses, or in any other suitable manner.

An electronic package 710 is coupled to system bus 702. The electronic package 710 can include any circuit or combination of circuits (e.g., electronic package 100 or electronic package 400). In one embodiment, the electronic package 710 includes a processor 712 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic package 710 are a custom circuit, an application-specific integrated circuit (ASIC), or the like, such as, for example, one or more circuits (such as a communications circuit 714) for use in wireless devices like mobile telephones, personal data assistants, portable computers, two-way radios, and similar electronic systems. The IC can perform any other type of function.

The electronic device 700 can also include an external memory 720, which in turn can include one or more memory elements suitable to the particular application, such as a main memory 722 in the form of random access memory (RAM), one or more hard drives 724, and/or one or more drives that handle removable media 726 such as compact disks (CD), flash memory cards, digital video disk (DVD), and the like.

The electronic device 700 can also include a display device 716, one or more speakers 718, and a keyboard and/or controller 730, which can include a mouse, trackball, touch screen, voice-recognition device, or any other device that permits a system user to input information into and receive information from the electronic device 700.

VARIOUS NOTES & EXAMPLES

Each of these non-limiting examples can stand on its own, or can be combined in various permutations or combinations with one or more of the other examples. To better illustrate the method and apparatuses disclosed herein, a non-limiting list of embodiments is provided here:

Example 1 includes an electronic package including a through-mold interconnect including a package assembly having a substrate including a first substrate surface, the first substrate surface including a conductive layer attached to the first substrate surface; a die communicatively coupled to the conductive layer; a contact block including a first contact surface on one end of the contact block, a second contact surface on an opposing side of the contact block, and a contact block wall extended therebetween, wherein the contact block includes a conductive material and the first contact surface is coupled to the package assembly with a joint located partially along the contact block wall; and an overmold covering portions of the substrate, conductive layer, and die, wherein the second contact surface of the contact block is exposed through the overmold.

Example 2 includes the electronic package of example 1, wherein the contact block is thermally conductive and configured as a heat sink.

Example 3 includes the electronic package of any one of examples 1-2, wherein the joint couples the contact block to the conductive layer, the die, or both.

Example, 4 includes the electronic package of any one of examples 1-3, wherein the cross sectional area of the conductive material on the contact block exceeds 0.05 mm$^2$.

Example 5 includes the electronic package of any one of examples 1-4, wherein a coefficient of thermal conductivity of the contact block exceeds 80 W·m$^{-1}$·k$^{-1}$.

Example 6 includes the electronic package of any one of examples 1-5, wherein the contact block includes a height exceeding 200 μm.

Example 7 includes the electronic package of any one of examples 1-6, wherein the contact block is magnetic.

Example 8 includes a method of making an electronic package having a contact block including: constructing a package assembly including: attaching a conductive layer to a substrate, attaching a die to the conductive layer; placing one or more contact blocks on the package assembly, each contact block including a first contact surface on a first end of the contact block, a second contact surface on an opposing second contact end of the contact block, and a contact block wall extended therebetween; coupling the one or more contact blocks to the package assembly, wherein a joint is located partially along the contact block wall; and covering a portion of the package assembly including a portion of the substrate, exposed conductive layer, and die with an overmold, wherein the second contact surface of the contact block remains exposed through the overmold.

Example 9 includes the method of making an electronic package of example 8, further comprising coupling a structure on the second contact surface of at least one contact block and on top of the overmold, wherein coupling the conductive structure includes coupling a thermally conductive structure configured as a heat sink.

Example 10 includes the method of making an electronic package of any one of examples 8-9, further comprising laminating an electrically conductive structure on the top of the overmold and in electrical communication with at least one contact block, the electrically conductive structure configured as an antenna.

Example 11 includes the method of making an electronic package of any one of examples 8-10, wherein placing the contact block includes placing a contact block including a total cross sectional area of conductive material exceeding 0.05 mm².

Example 12 includes the method of making an electronic package of any one of examples 8-11, wherein placing the contact block includes placing a contact block including a coefficient of thermal conductivity exceeding 80 W·m$^{-1}$·k$^{-1}$.

Example 13 includes the method of making an electronic package of any one of examples 8-12, wherein placing the contact block includes placing a magnetic contact block.

Example 14 includes a method of forming an aperture in an electronics package including: constructing a package assembly including: attaching a conductive layer to a substrate; attaching a die to the conductive layer; coupling one or more contact blocks to the package assembly, each contact block including a first contact surface on a first end of the contact block, a second contact surface on an opposing second contact end of the contact block, and a contact block wall extended therebetween, wherein the contact block includes a conductive material and the first contact surface is coupled to the package assembly at a joint located partially along the contact block wall; covering a portion of the package assembly including a portion of the substrate, exposed conductive layer, and die with an overmold, wherein the second contact surface of the contact block remains exposed through the overmold; and removing at least one of the contact blocks to form an aperture in the overmold.

Example 15 includes the method of example 14, wherein removing the contact block includes exposing a surface of the die.

Example 16 includes the method of any one of examples 14-15, wherein removing the contact block includes exposing a surface of the conductive layer.

Example 17 includes the method of any one of examples 14-16, wherein attaching the one or more contact blocks to the package assembly includes coupling at least one contact block to a component, wherein the component is coupled to the conductive layer.

Example 18 includes the method of any one of examples 14-17, wherein the component is selected from a group consisting of: an optical sensor, environmental sensor, capacitive sensor, or electrical sensor.

Example 19 includes the method of any one of examples 14-18, wherein the component includes a Fresnel lens.

Example 20 includes the method of examples 14-19, wherein the component includes metamaterial.

Example 21 includes the method of any one of examples 14-21, further comprising locating a component within the aperture and coupling the component to an exposed portion of the conductive layer or the die within the aperture, the component selected from a group consisting of: a Fresnel lens, optical sensor, environmental sensor, capacitive sensor, or electrical sensor.

Examples 22 includes an electronic package including a through-mold interconnect including: a package assembly including: a substrate including a first substrate surface, the first substrate surface including a conductive layer attached to the first substrate surface; a die communicatively coupled to the conductive layer; a contact block assembly including: a carrier including a first carrier surface, a second carrier surface, and a carrier wall extended between the first carrier surface and the second carrier surface, wherein the carrier includes at least one interstice extended from the first carrier surface to the second carrier surface, at least one contact block located within the interstice of the carrier, the at least one contact block having a first contact surface on one end of the contact block and a second contact surface on an opposing side of the contact block, wherein the contact block includes a conductive material and the first contact surface is coupled to the package assembly with a joint located partially along the carrier wall; and an overmold covering the package assembly, the overmold covering a portion of the substrate, conductive layer, and die, wherein the second contract surface is exposed through the overmold.

Example 23 includes the electronic package of example 22, wherein the carrier includes a material having a loss tangent between 0.002 and 0.007.

Example 24 includes the electronic package of any one of examples 22-23, wherein the carrier is an elastomeric material.

Example 25 includes the electronic package of any one of examples 22-24, wherein the total cross sectional area of the one or more contact blocks exceeds 0.05 mm².

Example 26 includes the electronic package of any one of examples 22-25, wherein an insulator is disposed between the contact block and the carrier.

Each of these non-limiting examples can stand on its own, or can be combined in various permutations or combinations with one or more of the other examples.

The above detailed description includes references to the accompanying drawing, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the teen "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electronic package including a through-mold interconnect comprising:
   a package assembly including:
   a substrate including a first substrate surface, the first substrate surface including a conductive layer attached on the first substrate surface;
   a die communicatively coupled to the conductive layer;
   a contact block including a first contact surface on one end of the contact block, a second contact surface on an opposing side of the contact block, and a contact block wall extended therebetween, wherein the contact block includes a conductive material and the first contact surface is coupled to the package assembly with a joint located partially along the contact block wall;
   a contact block assembly situated on and physically connected to the first substrate surface, wherein the contact block assembly includes a plurality of second contact blocks in the contact block assembly separated from each other by a carrier and separated from the carrier by respective insulators, wherein the carrier includes polyamide, epoxy, FR-4, or prepreg; and
   an overmold covering portions of the substrate, conductive layer, and die, wherein the second contact surface of the contact block is exposed through the overmold and a surface of the second contact blocks is exposed through the overmold.

2. The electronic package of claim 1, wherein the contact block is thermally conductive and configured as a heat sink.

3. The electronic package of claim 1, wherein the joint couples the contact block to the conductive layer, the die, or both.

4. The electronic package of claim 1, wherein the cross-sectional area of the conductive material on the contact block exceeds 0.05 mm$^2$.

5. The electronic package of claim 1, wherein a coefficient of thermal conductivity of the contact block exceeds 80 $W \cdot m^{-1} \cdot k^{-1}$.

6. The electronic package of claim 1, wherein the contact block includes a height exceeding 200 µm.

7. The electronic package of claim 1, wherein the contact block is magnetic.

8. The electronic package of claim 1, wherein the contact block includes a cavity with a first aperture at the second contact surface and a second aperture at the first contact surface, the first aperture including a width less than a width of the second aperture.

9. The electronic package of claim 8, wherein the contact block includes at least one element selected from a group consisting of: a structural reinforcement, a threaded bushing, an electromagnetic shield, and a filter.

10. The electronic package of claim 1, further comprising an epoxy resin or liquid crystal polymer coating on the contact block.

11. The electronic package of claim 1, further comprising a solder or nickel plating coated on the contact block.

12. The electronic package of claim 1, wherein the contact block assembly includes a carrier including a first carrier surface facing and physically connected with the first substrate surface and a second carrier surface facing away from the first substrate surface, and wherein the plurality of second contact blocks are coplanar with the second carrier surface.

13. The electronic package of claim 12, further comprising solder or adhesive connecting the contact block assembly to the first substrate surface.

14. The electronic package of claim 12, further comprising a conductive structure bonded to the exposed surface of the second contact blocks and intervening molding material.

15. A package assembly comprising:
   a substrate including a first substrate surface, the first substrate surface including a conductive layer attached on the first substrate surface;
   a die communicatively coupled to the conductive layer;
   a contact block assembly including a first contact surface and a second contact surface on an opposing side of the contact block assembly, and a contact block wall extended therebetween, wherein each contact block of contact blocks of the contact block assembly includes a conductive material and the first contact surface is physically connected to the first substrate surface, wherein the contact blocks of the contact block assembly are separated from each other by a carrier and separated from the carrier by respective insulators, wherein the carrier includes polyamide, epoxy, FR-4, or prepreg; and
   an overmold covering portions of the substrate, conductive layer, and die, wherein the second contact surface of the contact block assembly is exposed through the overmold.

16. The package assembly of claim 15, further comprising a contact block that includes a microfluidic conduit.

17. The package assembly of claim 15, further comprising solder or adhesive connecting the contact block assembly to the first substrate surface.

* * * * *